(12) United States Patent
Machida et al.

(10) Patent No.: US 8,888,253 B2
(45) Date of Patent: Nov. 18, 2014

(54) METHOD OF MANUFACTURING ELECTROMECHANICAL TRANSDUCER LAYER, METHOD OF MANUFACTURING ELECTROMECHANICAL TRANSDUCER ELEMENT, ELECTROMECHANICAL TRANSDUCER LAYER FORMED BY THE METHOD, ELECTROMECHANICAL TRANSDUCER ELEMENT, INKJET HEAD AND INKJET RECORDING APPARATUS

(75) Inventors: Osamu Machida, Kanagawa (JP); Atsushi Takeuchi, Kanagawa (JP); Dongsik Jang, Kanagawa (JP); Ryoh Tashiro, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 204 days.

(21) Appl. No.: 13/368,631

(22) Filed: Feb. 8, 2012

(65) Prior Publication Data

US 2012/0206544 A1  Aug. 16, 2012

(30) Foreign Application Priority Data

Feb. 15, 2011  (JP) ................. 2011-029975

(51) Int. Cl.
*B41J 2/045* (2006.01)
*B41J 2/165* (2006.01)
(Continued)

(52) U.S. Cl.
CPC ............. *B41J 2/161* (2013.01); *H01L 41/0805* (2013.01); *H01L 41/317* (2013.01); *B41J*
(Continued)

(58) Field of Classification Search
CPC .................... B41J 2/14233; B41J 2/161; B41J 2002/14491; B41J 2/1623; B41J 2002/14419; B41J 2/085; B41J 2/09; B41J 2/075; B41J 2/115; B41J 2/12; B81B 2201/0235; B81B 2203/0118; B81B 2201/0271; G01P 15/125; G01P 2015/082; H01H 59/00; B81C 1/00246;
C04B 35/495; C04B 2235/3201; C04B 2235/3251; C04B 35/462; C04B 35/48; C04B 35/50; C04B 35/51; H01L 41/187; H01L 41/18
USPC ......................... 347/68, 76; 257/415; 438/50; 252/62.9 R, 629 PZ
See application file for complete search history.

(56) References Cited

U.S. PATENT DOCUMENTS 5,298,926 A * 3/1994 Fukushima et al. ............ 347/34
7,530,671 B2  5/2009 Kosugi
(Continued)

FOREIGN PATENT DOCUMENTS

JP  5-518  8/1993
JP  2003-297825  10/2003
(Continued)

OTHER PUBLICATIONS

Budd, K.D., et al. (1985), "Sol-Gel Processing of $PbTiO_3$, $PbZrO_3$, PZT, and PLZT Thin Films," Proc. Brit. Cerm. Soc. 36, pp. 107-121.
(Continued)

*Primary Examiner* — Lisa M Solomon
(74) *Attorney, Agent, or Firm* — Cooper & Dunham LLP

(57) ABSTRACT

Disclosed is a method of manufacturing an electromechanical transducer layer on a surface of a substrate, including discharging a solution including a source material to form the electromechanical transducer layer from a nozzle of a nozzle plate to coat the solution on the surface of the substrate while applying voltage between the nozzle plate and the substrate to charge the nozzle plate at a first polarity and the substrate at a second polarity opposite to the first polarity such that a split droplet split from a main droplet which is coated on the surface of the substrate becomes charged at the second polarity and is attracted and collected by the nozzle plate; and applying a heat treatment to the substrate on which the solution is coated to crystallize the solution to form the electromechanical transducer layer.

17 Claims, 14 Drawing Sheets

(51) Int. Cl.
*H01L 41/08* (2006.01)
*H01L 41/317* (2013.01)
*B41J 2/16* (2006.01)
*H01L 41/09* (2006.01)
*H01L 41/187* (2006.01)

(52) U.S. Cl.
CPC ... *2/1628* (2013.01); *H01L 41/0973* (2013.01); *B41J 2/1642* (2013.01); *H01L 41/1876* (2013.01); *B41J 2/1646* (2013.01); *B41J 2/1631* (2013.01)
USPC .............................................. 347/68; 347/34

(56) References Cited

U.S. PATENT DOCUMENTS

| | | | |
|---|---|---|---|
| 7,713,348 | B2 | 5/2010 | Kijima et al. |
| 2004/0101980 | A1 | 5/2004 | Kurokawa et al. |
| 2011/0175967 | A1* | 7/2011 | Machida et al. ................ 347/54 |
| 2011/0205307 | A1 | 8/2011 | Ueda et al. |
| 2012/0028075 | A1 | 2/2012 | Yagi et al. |

FOREIGN PATENT DOCUMENTS

| | | |
|---|---|---|
| JP | 2005-136151 | 5/2005 |
| JP | 2006-272635 | 10/2006 |
| JP | 4269172 | 3/2009 |

OTHER PUBLICATIONS

Kumar, Amit, et al. (1993), "Features of gold having micrometer to centimeter dimensions Can be formed through a combination of stamping with an elastomeric stamp and an alkanethiol "ink" followed by chemical etching," Applied Physics Letters, vol. 63, No. 14, pp. 2002-2004.

* cited by examiner

METHOD OF MANUFACTURING ELECTROMECHANICAL TRANSDUCER LAYER, METHOD OF MANUFACTURING ELECTROMECHANICAL TRANSDUCER ELEMENT, ELECTROMECHANICAL TRANSDUCER LAYER FORMED BY THE METHOD, ELECTROMECHANICAL TRANSDUCER ELEMENT, INKJET HEAD AND INKJET RECORDING APPARATUS

BACKGROUND OF THE INVENTION

1. Field of the Invention

The present invention relates to a method of manufacturing an electromechanical transducer layer, a method of manufacturing an electromechanical transducer element, an electromechanical transducer layer, an electromechanical transducer element, an inkjet head and an inkjet recording apparatus, and more specifically, to a method of manufacturing an electromechanical transducer layer by an inkjet method, a method of manufacturing an electromechanical transducer element, an electromechanical transducer layer, an electromechanical transducer element, an inkjet head and an inkjet recording apparatus.

2. Description of the Related Art

An inkjet recording apparatus has many merits such that noise is low, capable of printing fast, capable of using a variety of liquids as ink and capable of forming an image on a cheap recording medium such as a paper. Therefore, the inkjet recording apparatus has been used for many kinds of image recording apparatuses such as a printer, a copying machine, a facsimile machine or the like.

For the inkjet recording apparatus, an inkjet head (liquid discharging head) is used. The inkjet head includes a nozzle plate provided with nozzles for discharging ink droplets, pressure rooms to be in communication with the nozzles respectively, and pressure generating units to apply pressure to ink in the pressure rooms.

The pressure generating unit includes an electromechanical transducer element such as a piezoelectric element or the like or an electrothermal element such as a heater or the like for applying pressure to the ink in the pressure room, or an energy generating unit including a vibration layer which composes a wall of the pressure room and an electrode provided to face the vibration layer.

The pressure generating unit using the electromechanical transducer element which is a so-called "piezo type" is widely developed as it is capable of functioning fast, providing a high density alignment and using liquids of a large variety of viscosities.

The electromechanical transducer element includes a stacked structure of a lower electrode, an electromechanical transducer layer and an upper electrode. By applying voltage between the lower electrode and the upper electrode, the electromechanical transducer layer deforms to press a vibration layer at the pressure room and discharge ink in the pressure room from the nozzle.

The inkjet head includes the plural pressure rooms. For individually applying pressure to the pressure rooms, the plural electromechanical transducer elements are provided for the plural pressure rooms, respectively.

For the electromechanical transducer layer, a mixed metal oxide layer which is mainly composed of metal oxide such as zirconate lead titanate (PZT) ceramics or the like is used.

For a method of manufacturing the electromechanical transducer layer of an electromechanical transducer element composed of a stacked structure of a lower electrode, a ceramics layer as the electromechanical transducer layer, and an upper electrode, it is disclosed that the ceramics layer is formed by two or more of inkjet heads (patent document 1). In this method, two or more solutions each including a source material are separately discharged from the different inkjet heads to form the ceramics layer on the lower electrode.

Further, it is disclosed in patent document 2 that a ferroelectric layer is formed by discharging from an inkjet head a solution including a material for forming the ferroelectric layer adjusted for the inkjet head.

PATENT DOCUMENTS

[Patent Document 1] Japanese Laid-open Patent Publication No. 2003-297825
[Patent Document 2] Japanese Patent No. 4,269,172

However, the solution including a material for forming the electromechanical transducer layer has a viscosity lower than that of ink used in a usual inkjet recording apparatus. Especially, a solvent capable of dissolving materials for forming a PZT layer has a low viscosity. Therefore, when such a solution is discharged from a nozzle, small droplets smaller than a main droplet of the solution are easily split from the main droplet. The small split droplet may have a volume about $1/1000$ of the main droplet, for example. Further, the moving speed of the small split droplet becomes slow because of air resistance.

Therefore, the small split droplets may attach on the surface of the lower electrode or the like where the electromechanical transducer layer is not intended to be formed. As the small split droplets easily become mist by air resistance, the small split droplets easily diffuse to attach on the surface of the lower electrode or the like where the electromechanical transducer layer is not intended to be formed.

When the split droplets are formed on the surface of the lower electrode or the like where the electromechanical transducer layer is not intended to be formed, patterning failure of the electromechanical transducer layer occurs and uniformity of the electromechanical transducer layer cannot be maintained.

For example, it may be considered to improve a waveform of a drive signal to apply the electromechanical transducer element in order to suppress generation of the split droplets. However, it is very difficult to adjust the waveform of the drive signal not to generate the split droplets.

SUMMARY OF THE INVENTION

The present invention is made in light of the above problems, and provides a method of manufacturing an electromechanical transducer layer by which an electromechanical transducer layer having a desired pattern can be formed with high accuracy without attaching unnecessary droplets of a solution, including a source material for forming the electromechanical transducer layer on a substrate when discharging the solution from a nozzle of an inkjet head, a method of manufacturing an electromechanical transducer element including the electromechanical transducer layer, an electromechanical transducer element, an inkjet head and an inkjet recording apparatus.

According to an embodiment, there is provided a method of manufacturing an electromechanical transducer layer on a surface of a substrate, including placing the substrate so that the surface of the substrate faces a nozzle plate which is provided with a nozzle for discharging a solution including a source material to form the electromechanical transducer layer; discharging the solution from the nozzle of the nozzle plate to coat the solution on the surface of the substrate while applying voltage between the nozzle plate and the substrate to charge the nozzle plate at a first polarity and the substrate at a second polarity opposite to the first polarity, the solution discharged from the nozzle including a main droplet which is coated on the surface of the substrate and a split droplet split from the main droplet, the voltage being applied between the nozzle plate and the substrate such that the split droplet becomes charged at the second polarity and is attracted and collected by the nozzle plate; and applying a heat treatment to the substrate on which the solution is coated to crystallize the solution to form the electromechanical transducer layer.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
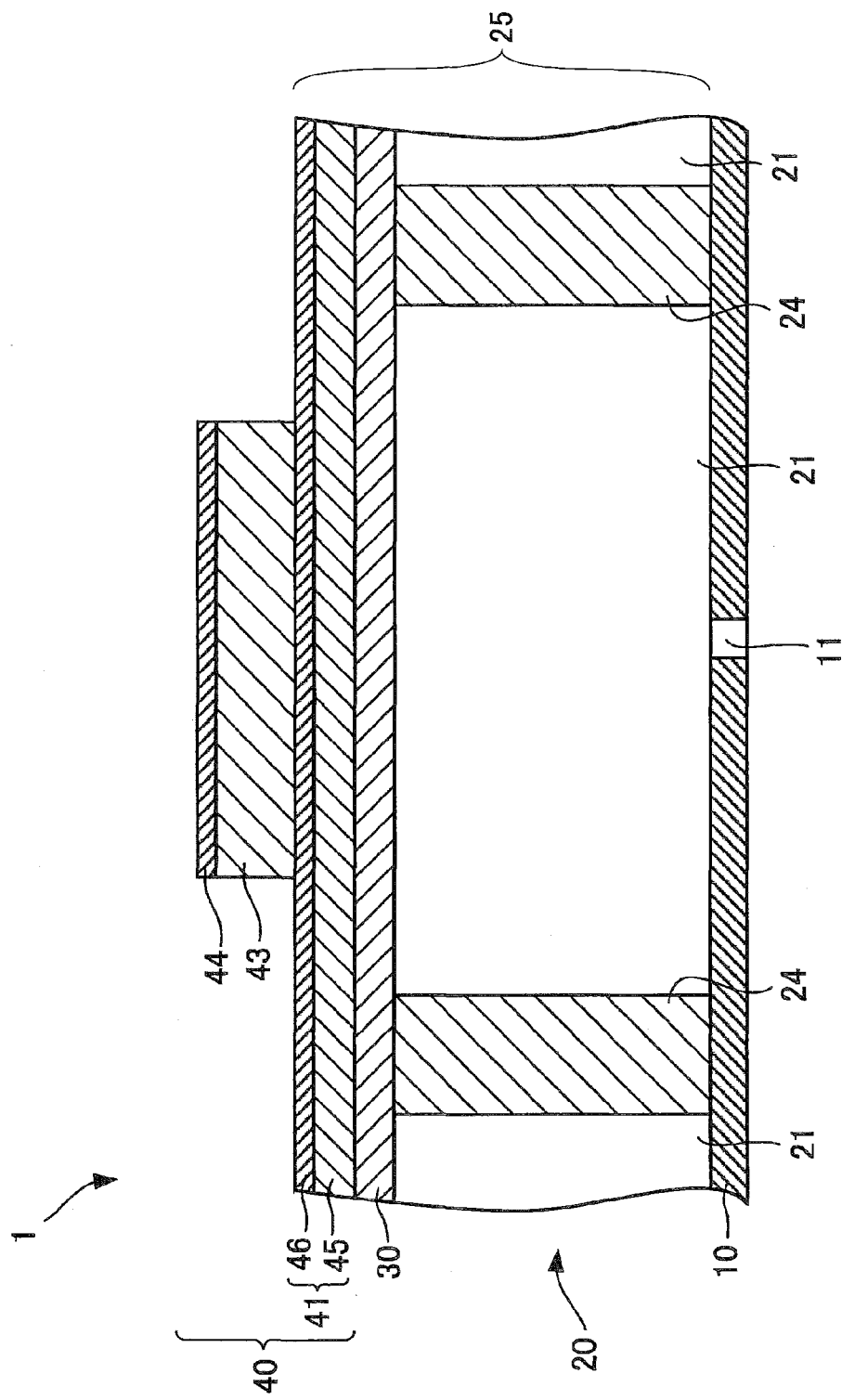
FIG. 1 is a cross sectional view showing an example of an inkjet head of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

Next, embodiments of the present invention will be described below with reference to drawings.

It is to be noted that, in the explanation of the drawings, the same components are given the same reference numerals, and explanations are not repeated.

The structure of an inkjet head 1 including an electromechanical transducer element 40 formed in accordance with a method of manufacturing the electromechanical transducer element 40 of an embodiment is explained with reference to FIG. 1 and FIG. 2.

Figure 2:
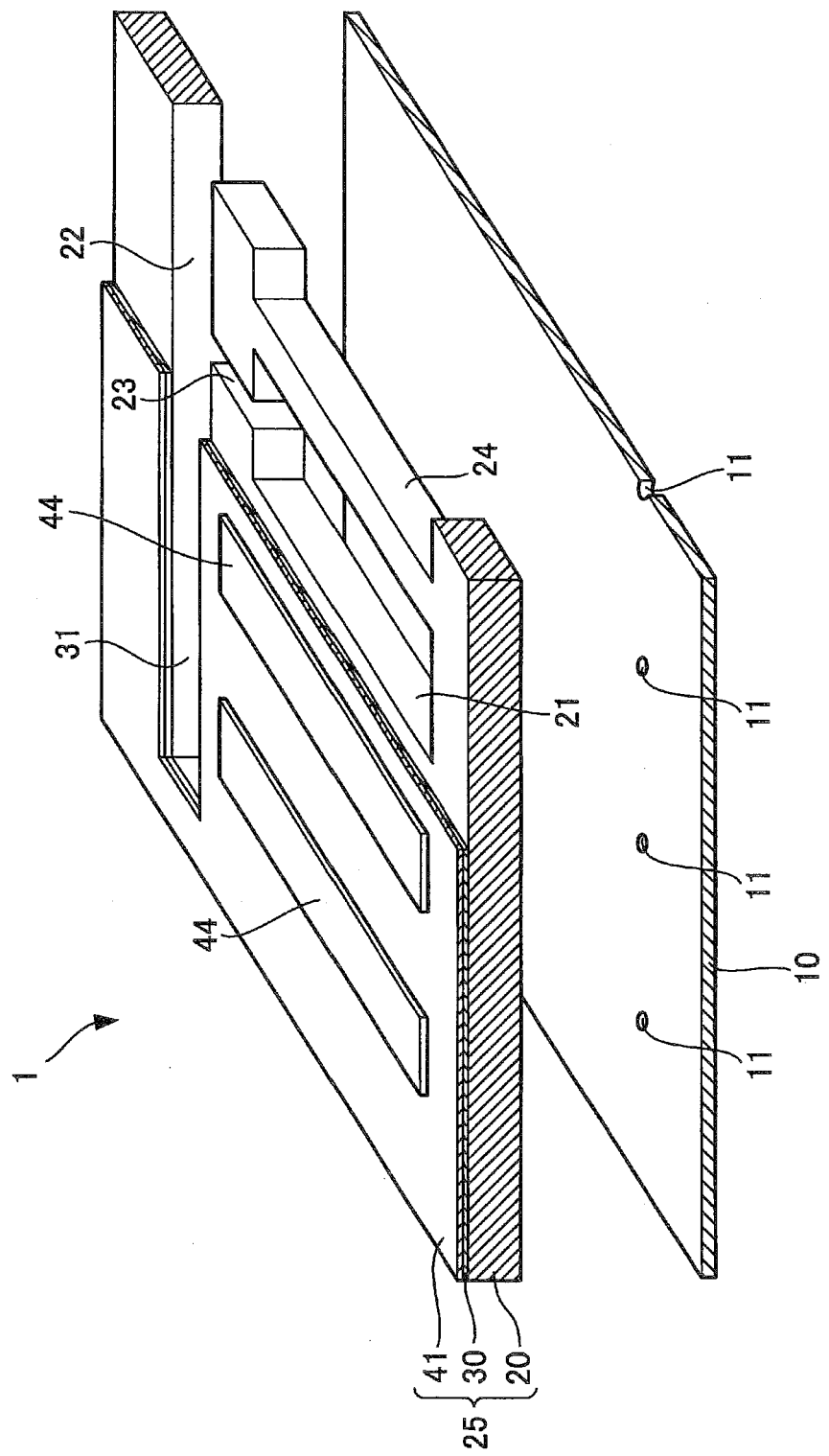
FIG. 2 is a perspective view showing an example of an inkjet head of an embodiment.
Figure 3:
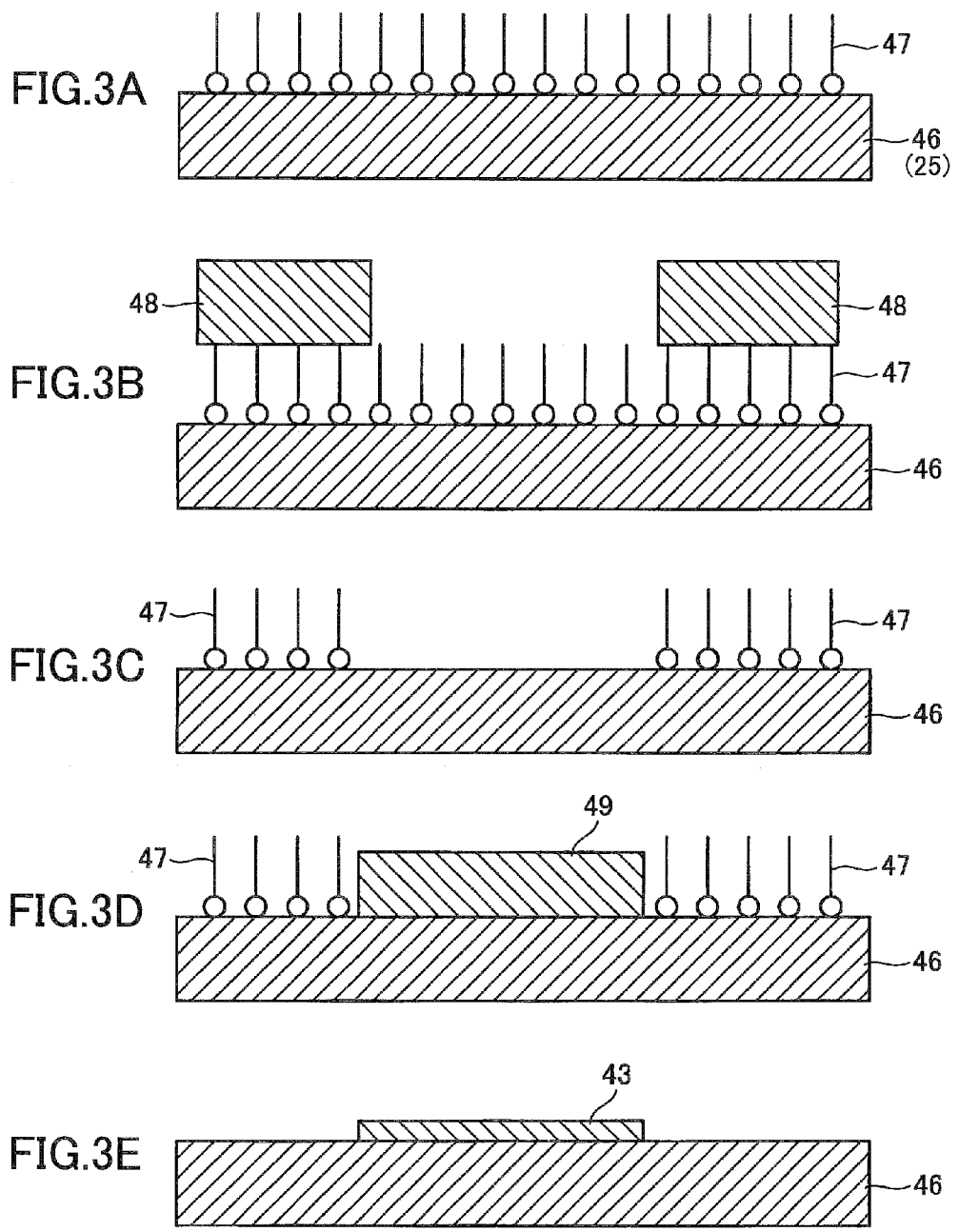
FIG. 3A to FIG. 3E are cross sectional views showing an example of a manufacturing process of an electromechanical transducer layer.

FIG. 1 is a cross sectional view showing an example of the inkjet head 1 of the embodiment. FIG. 2 is a perspective view showing an example of the inkjet head 1 of the embodiment.

The inkjet head 1 of the embodiment includes a nozzle plate 10, a silicon substrate 20, a vibration layer 30 and the plural electromechanical transducer elements 40 such as a piezoelectric element or the like stacked in this order.

The silicon substrate 20 is provided with a common ink room 22, plural pressure rooms 21 and plural ink channels 23 respectively connecting the plural pressure rooms 21 to the common ink room 22, formed to penetrate the silicon substrate 20 in its thickness direction. The ink channel 23 functions as a liquid resistance path that prevents reverse flow of the ink from the respective pressure room 21 to the common ink room 22. With this structure, the ink introduced into the common ink room 22 is supplied to the pressure rooms 21 through the respective ink channels 23. The pressure rooms 21, the ink channels 23 and the common ink room 22 are divided by the divisional walls 24.

The nozzle plate 10 is provided with nozzle holes 11 correspondingly provided with the pressure rooms 21. The vibration layer 30 is provided with an ink supply port 31 which is opened at a portion facing the common ink room 22 of the silicon substrate 20. The ink supply port 31 is structured to supply the ink, which is to be discharged as a droplet, to the common ink room 22 from outside.

In this embodiment, the inkjet head 1 is a side-shooter type in which ink droplets are discharged from the nozzle holes 11 provided in the nozzle plate 10.

Each of the electromechanical transducer elements 40 includes a lower electrode 41 as a first electrode, an electromechanical transducer layer 43, and an upper electrode 44 as a second electrode stacked in this order.

The lower electrode 41 includes a stacked structure of a metal oxide layer 45 and a metal layer 46 in this embodiment.

The lower electrode 41 is a common electrode which is commonly provided for the plural electromechanical transducer elements 40. The lower electrode 41 is formed on the entire surface of the vibration layer 30. The stacked structures of the electromechanical transducer layer 43 and the upper electrode 44 are separately provided to correspond to the pressure rooms 21, respectively. With this structure, by applying voltage to one of the upper electrodes 44, pressure is applied only to the pressure room 21 corresponding to the upper electrode 44 so that the ink is discharged from the pressure room 21. It means that discharging of the ink is separately controlled for each of the pressure rooms 21.

The operation of the inkjet head 1 is explained.

It is assumed that the pressure rooms 21 are previously filled with the ink. Under this condition, a pulse voltage of 20V, for example, is applied to one of the upper electrodes 44 corresponding to the nozzle hole 11 for which the ink is to be discharged based on image data by an oscillating circuit of a control unit (not shown in the drawings).

When the pulse voltage is applied from the upper electrode 44 to the electromechanical transducer element 40, the electromechanical transducer layer 43 instantly shrinks in a direction parallel to the vibration layer 30 by an electrostrictive effect. With this, the vibration layer 30 deforms toward the pressure room 21 to cause a sudden increase of the pressure in the pressure room 21 so that the ink is discharged from the nozzle hole 11.

After applying the pulse voltage, the shrunken electromechanical transducer layer 43 becomes its original shape and the deformed vibration layer 30 becomes its original shape. Therefore, the pressure in the pressure room 21 becomes negative with respect to that in the common ink room 22 and the ink is supplied from the common ink room 22 to the pressure room 21 through the ink channel 23.

By repeating the above operation, ink droplets are sequentially discharged and an image is formed on a recording medium such as a paper which is placed to face the inkjet head 1.

Next, a method of manufacturing the electromechanical transducer element 40 of the embodiment is explained with reference to FIG. 1.

First, a Silicon On Insulator (SOI) substrate including the silicon substrate 20, an embedded silicon oxide layer and an active silicon layer stacked in this order is prepared. Then, a silicon oxide layer is formed on the surface of the active silicon layer by a general thermal oxidation method.

The thickness of the silicon substrate 20 may be 400 µm, the thickness of the embedded silicon oxide layer may be 500 nm, the thickness of the active silicon layer may be 2 µm and the thickness of the silicon oxide layer may be 300 nm, for example. The vibration layer 30 is composed by the embedded silicon oxide layer, the active silicon layer and the silicon oxide layer.

As described above, the lower electrode 41 which is formed on the surface of the vibration layer 30 functions as the common electrode to input signal to the electromechanical transducer elements 40. Therefore, the vibration layer 30 formed under the lower electrode 41 may be an insulating layer, or if the vibration layer 30 is composed of conductive material, the surface needs to be insulated. In this embodiment, the vibration layer 30 is provided to include the insulating layers such as the embedded silicon oxide layer and the silicon oxide layer.

The vibration layer 30 may alternatively include a silicon oxide layer, a silicon nitride layer, a silicon oxynitride layer or a stacked structure of these layers, for example. These silicon including insulating layers may be a thermal oxidation layer or a chemical vapor deposition (CVD) layer.

Alternatively, considering the difference in thermal expansion, the vibration layer 30 may be an insulated ceramic layer such as an aluminum oxide layer, a zirconia layer or the like. These metallic oxide layers may be formed by sputtering.

Subsequently, the lower electrode 41 is formed on the surface of the vibration layer 30.

First, the metal oxide layer 45 is formed on the surface of the vibration layer 30 by sputtering.

Then, a metal layer 46 is formed on the surface of the metal oxide layer 45 by sputtering, for example. The metal layer 46 may be a platinum layer. The material for the metal layer 46 will be explained later.

Hereinafter, a stacked structure of the silicon substrate 20, the vibration layer 30 and the lower electrode 41 is referred to as a substrate structure 25.

Then, the electromechanical transducer layer 43 is formed on the metal layer 46 of the lower electrode 41. As will be explained in detail later, the electromechanical transducer layer 43 is formed by coating a solution including a source material to form the electromechanical transducer layer 43 on the surface of the lower electrode 41. The solution may be a sol including polar (hydrophilic) solvent.

In this embodiment, before forming the electromechanical transducer layer 43 on the metal layer 46 of the lower electrode 41, a surface reforming process is performed on the lower electrode 41 so that a first part of the surface of the lower electrode 41 where the solution is not intended to be coated selectively inhibits the coating of the solution. Concretely, the surface reforming process is performed so that the first part of the surface of the lower electrode 41 where the solution is not intended to be coated becomes hydrophobic while a second part of the surface of the lower electrode 41 where the solution is intended to be coated becomes hydrophilic.

In this embodiment, the metal layer 46 formed at the surface of the lower electrode 41 is hydrophilic. In this case, when the solution to form the electromechanical transducer layer 43, which is hydrophilic, is coated on the surface of the metal layer 46, it may cylindrically spread and may be attached to the portion of the first part of the surface of the lower electrode 41 where the solution is not intended to be coated. Therefore, in this embodiment, a hydrophobic layer is selectively formed on the first part of the surface of the lower electrode 41 where the solution is not intended to be coated.

The method of performing the surface reforming process and forming the electromechanical transducer layer 43 is explained with reference to FIG. 3A to FIG. 3E. FIG. 3A to FIG. 3E are cross sectional views showing an example of a manufacturing processes of the electromechanical transducer layer 43.

In this embodiment, a Self-Assembled Monolayer (SAM) layer 47 is selectively formed, as the hydrophobic layer, on the first part of the surface of the lower electrode 41 where the solution is not intended to be coated.

First, as shown in FIG. 3A, the Self-Assembled Monolayer (SAM) layer 47 is formed on the entire surface of the metal layer 46. The SAM layer 47 is formed by soaking the substrate structure 25 in alkanethiol solution.

Alkanethiol solution in this embodiment may be obtained by dissolving alkanethiol having a structure $CH_3(CH_2)$—SH in a general organic solvent such as alcohol, acetone, toluene or the like at a concentration of a few mol/L.

After soaking the substrate structure 25 in the alkanethiol solution for a predetermined period, the substrate structure 25 is taken out to be washed by solvent to remove extra alkanethiol and dried. With this, the organic molecules are self-aligned at the surface of the metal layer 46 to form the SAM layer 47 (hydrophobic layer of alkane). The SAM layer 47 includes alkyl groups at its surface. Therefore, the surface of the SAM layer 47 becomes hydrophobic.

Then, as shown in FIG. 3B, a photoresist 48 having a predetermined pattern is formed as a mask on the surface of the SAM layer 47 by photolithography. The photoresist 48 is formed on the first part where the electromechanical transducer layer 43 is not intended to be coated to cover the SAM layer 47.

Thereafter, as shown in FIG. 3C, the SAM layer 47 not covered by the photoresist 48 is removed by dry-etching such as irradiating oxygen plasma or irradiating ultraviolet (UV) light using the photoresist 48 as a mask. Then, the photoresist 48 is removed (FIG. 3C). With these operations, the SAM layer 47 is selectively formed at the first part where the electromechanical transducer layer 43 is not intended to be coated (surface reforming process).

The SAM layer 47 is hydrophobic whose angle of contact of pure water is 92°, for example. On the other hand, the surface of the metal layer 46 which is exposed by removing the SAM layer 47 is hydrophilic whose angle of contact of pure water is 5°, for example.

Then, as shown in FIG. 3D, the solution (PZT solution 49) including the source material to form the electromechanical transducer layer 43 is coated on the metal layer 46 (solution coating process).

In this embodiment, the electromechanical transducer layer 43 may be a mixed metal oxide layer which is mainly composed of metal oxide such as zirconate lead titanate (PZT) ceramics or the like. The PZT solution 49 may be prepared as will be described in example 2, for example.

The PZT solution 49 is coated on the metal layer 46 by a liquid discharging head 50 to form the electromechanical transducer layer 43. This process will be explained later in detail.

Here, the PZT solution 49 is not coated on the hydrophobic SAM layer 47 and the PZT solution 49 is selectively coated on the hydrophilic metal layer 46 where the SAM layer 47 is removed. It means that, in this embodiment, the PZT solution 49 is selectively coated by using a contrast of surface energy between the hydrophobic surface and the hydrophilic surface.

Thereafter, as shown in FIG. 3E, the coated PZT solution 49 is applied with heat treatment including drying at 120° C., for example (drying process), pyrolytically decomposing at 500° C., for example (pyrolytically decomposing process) and then crystallizing at 700° C. for example (crystallization process).

With this method, the electromechanical transducer layer 43 can be obtained by sol-gel method and the SAM layer 47 is removed by the heat treatment (electromechanical transducer layer forming process).

Then, the upper electrode 44 is formed on the surface of the electromechanical transducer layer 43 by sputtering (second electrode forming process). The upper electrode 44 may include a metal layer of a metal included in a platinum group metal or its oxide. Alternatively, the upper electrode 44 may be formed by an inkjet method, similar to the method of forming the electromechanical transducer layer 43 in this embodiment, as will be explained in example 6.

With this, the electromechanical transducer element 40 is manufactured.

The metal layer 46 of the lower electrode 41 may be composed of a material having a heat-resistance and capable of forming the SAM layer 47 by the reaction with alkanethiol. The metal layer 46 of the lower electrode 41 may be a metal layer of a metal included in a platinum group metal such as platinum, rhodium, ruthenium or iridium, an alloy of these metals such as platinum-rhodium including platinum as a main component, or its oxide. These materials are capable of reacting with thiol so that the SAM layer 47 can be properly formed. Further, these materials are not altered by a heat treatment of about 500° C. to 700° C. and the crystallization of the electromechanical transducer layer 43 can be appropriately performed on the layer formed by these materials.

Although, cupper or silver is capable of forming the SAM layer, considering the heat treatment, the above materials such as platinum or the like are preferable. Further, although gold can also be capable of forming the SAM layer and is not altered by a heat treatment about 500° C. to 700° C., considering the crystallization of the electromechanical transducer layer 43, the above materials such as platinum or the like are preferable.

Next, the method of forming the electromechanical transducer layer 43 by the liquid discharging head 50, which is used to coat the PZT solution 49 as shown in FIG. 3D, is explained.

The method of coating the PZT solution 49 using the liquid discharging head 50 is explained in detail with reference to FIG. 4 to FIG. 8.

FIG. 4 to FIG. 8 are cross sectional views showing the structure of the liquid discharging head 50.

The liquid discharging head 50 includes a nozzle plate 51, a silicon substrate (not shown in the drawings), a vibration layer 52 and plural electromechanical transducer elements 53 stacked in this order.

The nozzle plate 51 is provided with plural nozzle holes 54. The liquid discharging head 50 is a side-shooter type in which droplets of liquid are discharged from the nozzle holes 54 provided in the nozzle plate 51.

The silicon substrate (not shown in the drawings) is provided with pressure rooms 55 in which the PZT solution 49 is introduced. The structure of the liquid discharging head 50 is similar to that of the inkjet head 1 explained above with reference to FIG. 1 and FIG. 2 and the detailed explanation is not repeated.

A drive power source 56 is connected to the electromechanical transducer element 53. The drive power source 56 applies a drive signal, which is a pulse voltage, for discharging the PZT solution 49 from the nozzle hole 54 of the nozzle plate 51 in accordance with a predetermined control program and control data.

When the drive signal is applied to the electromechanical transducer element 53 from the drive power source 56, the electromechanical transducer element 53 instantly shrinks to deform the vibration layer 52 toward the pressure room 55. With this operation, the pressure in the pressure room 55 is increased and droplets of the PZT solution 49 are discharged from the nozzle hole 54.

The substrate structure 25 on which the PZT solution 49 is to be coated is positioned so that the metal layer 46 faces the nozzle plate 51 of the liquid discharging head 50. The distance between the nozzle plate 51 and the metal layer 46 may be about 0.5 mm to 1 mm, similar to the distance between the nozzle surface and an object to be printed for printing in a usual inkjet recording apparatus.

In this embodiment, the PZT solution 49 is discharged from the nozzle hole (nozzle) 54 of the nozzle plate 51 to coat the PZT solution 49 on the surface of the metal layer 46 (substrate) while applying voltage between the nozzle plate 51 and the metal layer 46 to charge the nozzle plate 51 at a first polarity and the metal layer 46 at a second polarity opposite to the first polarity.

The substrate structure 25 is placed on a plate of a deflection electrode 57. The deflection electrode 57 is connected to a voltage apply power source 58 that applies deflection voltage of the first polarity. The first polarity is a positive charge and the second polarity is a negative charge in this embodiment. The nozzle plate 51 is grounded to be charged at the second polarity.

Therefore the deflection electrode 57 and the substrate structure 25 are positively charged. On the other hand, the liquid discharging head 50 and the PZT solution 49 are negatively charged. In FIG. 4 to FIG. 8, a "+" expresses positively charged ion molecules and a "−" expresses negatively charged ion molecules.

Figure 4:
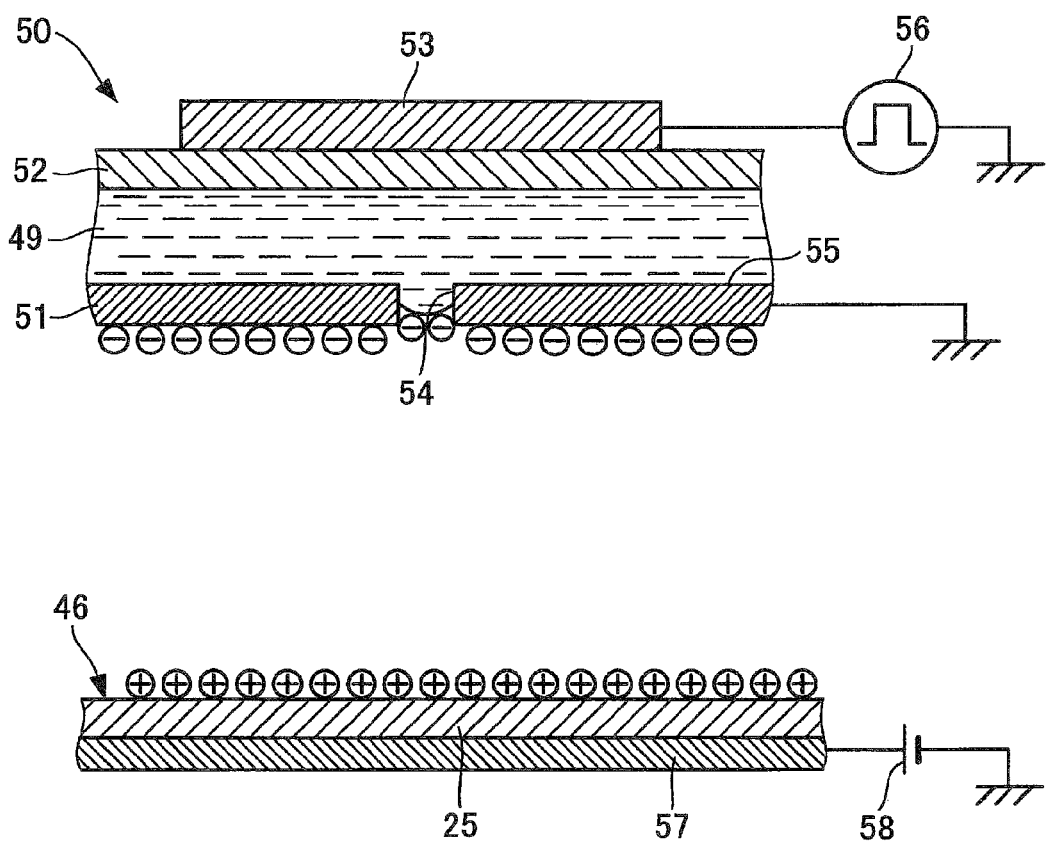
FIG. 4 is a cross sectional view showing an example of a manufacturing process of an electromechanical transducer layer.

As shown in FIG. 4, before the drive signal to discharge the PZT solution 49 is applied to the electromechanical transducer element 53, the deflection voltage of the first polarity is applied to the deflection electrode 57 by the voltage apply power source 58 so that the substrate structure 25 becomes positively charged while the nozzle plate 51 and the PZT solution 49 are negatively charged.

Figure 5:
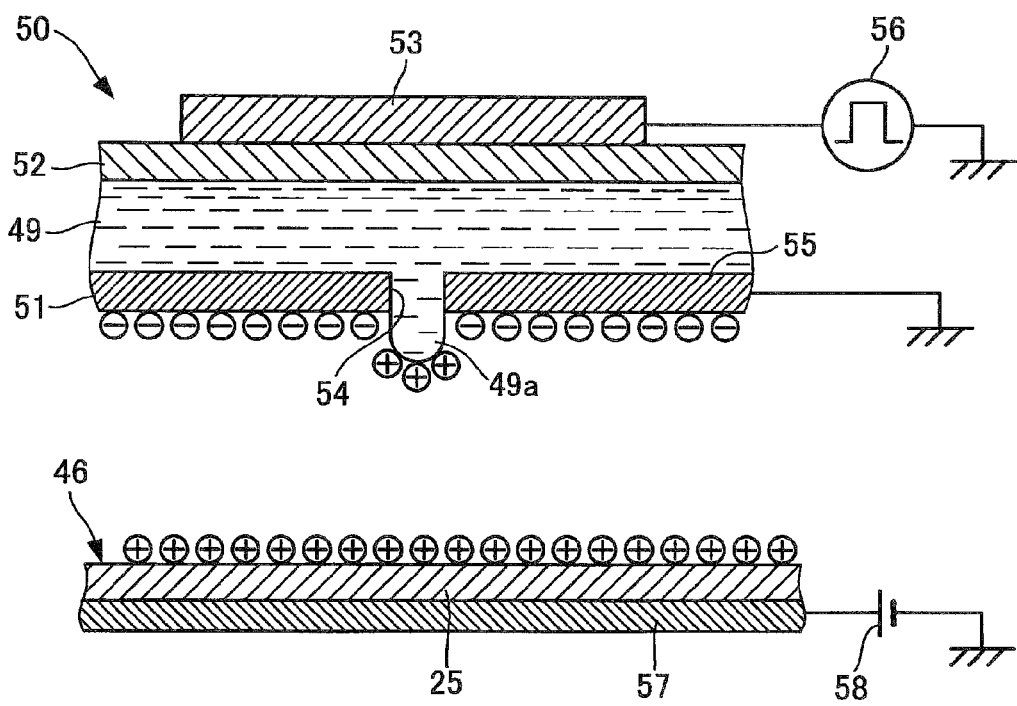
FIG. 5 is a cross sectional view showing an example of a manufacturing process of an electromechanical transducer layer.

As shown in FIG. 5, when the drive signal is applied by the drive power source 56, the PZT solution 49 is starting to be discharged from the nozzle hole 54 so that the front edge 49a of the columnar PZT solution 49 protrudes from the nozzle hole 54. The PZT solution 49 that passes through the negatively charged nozzle hole 54 becomes the opposite polarity of the nozzle hole 54 to be positively charged by frictional electrification.

As the nozzle plate 51 is negatively charged, positively charged ion molecules in the PZT solution 49 before splitting into droplets are attracted toward the nozzle plate 51. Negatively charged ion molecules in the PZT solution 49 before splitting into droplets move in the direction opposite to the nozzle plate 51 against the positively charged ion molecules.

Figure 6:
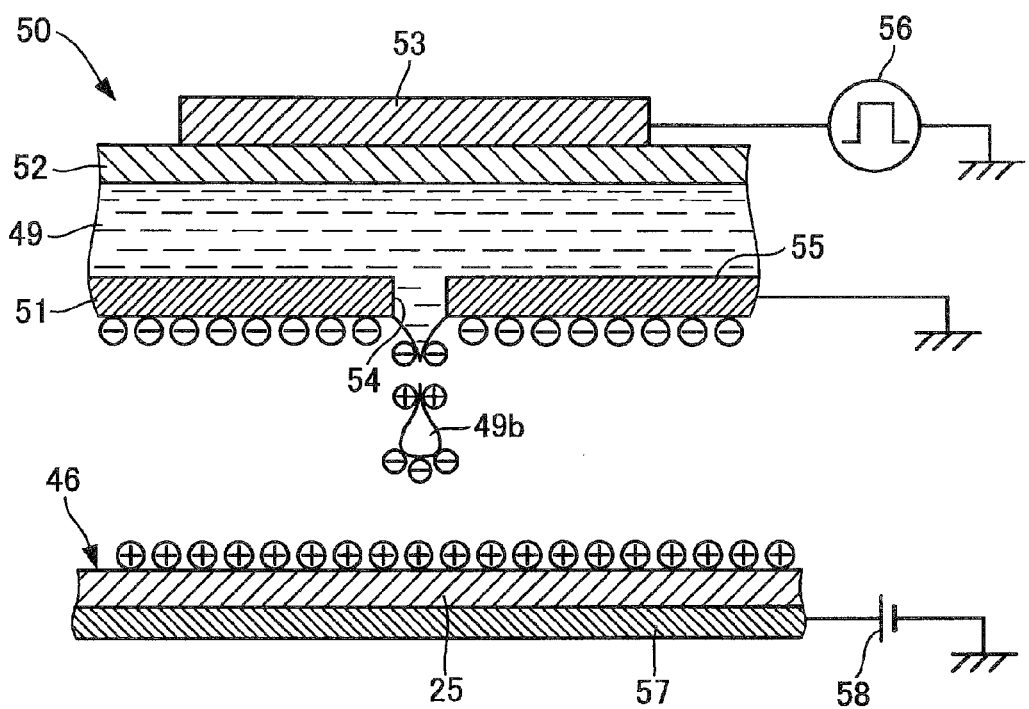
FIG. 6 is a cross sectional view showing an example of a manufacturing process of an electromechanical transducer layer.

As shown in FIG. 6, the PZT solution 49 that protrudes outside the nozzle plate 51 is split as stringiness from the PZT solution 49 within the nozzle plate 51 to be a main droplet 49b (discharging process). When the main droplet 49b is split, as the nozzle plate 51 is negatively charged, the positively charged ion molecules in the main droplet 49b are gathered at the side near the nozzle plate 51 and the negatively charged ion molecules are gathered at the side opposite to the nozzle plate 51.

Figure 7:
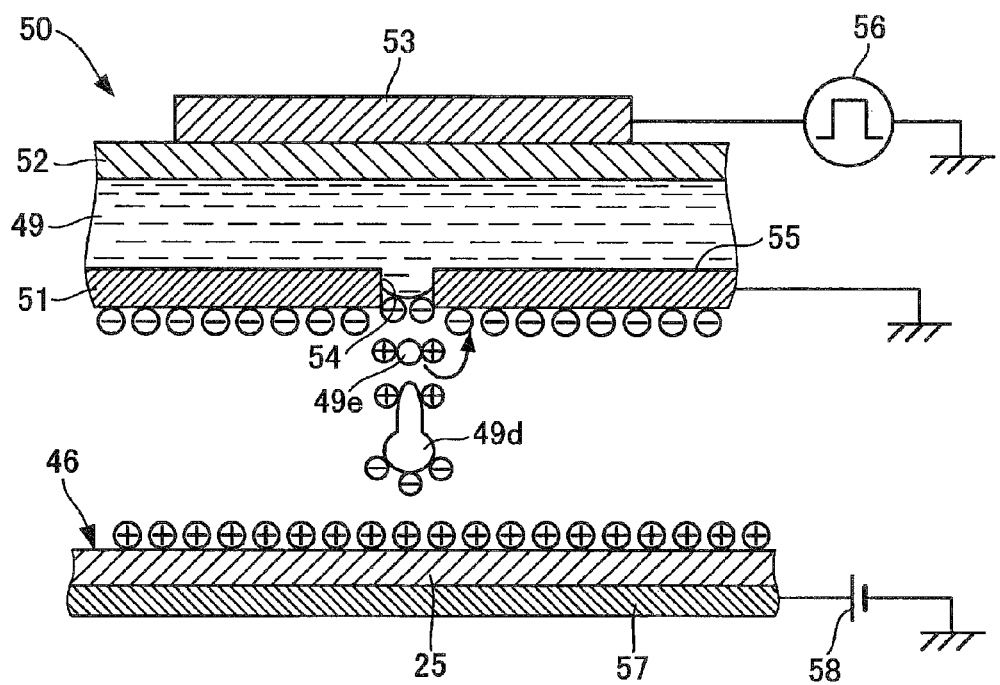
FIG. 7 is a cross sectional view showing an example of a manufacturing process of an electromechanical transducer layer.

As shown in FIG. 7, a split droplet 49e is split from the main droplet 49d. As the portion in the main droplet 49d near the nozzle plate 51 is split as the split droplet 49e, the split droplet 49e is positively charged.

The diameter of the main droplet 49d may be about 30 μm and the diameter of the split droplet 49e may be about a few μm. The moving speed of the main droplet 49d may be about 6 to 8 m/s and the moving speed of the split droplet 49e may be about less than or equal to 4 m/s. Therefore, the split droplets 49e are generated as mist.

As the split droplet 49e is positively charged while the nozzle plate 51 is negatively charged, there is an electrostatic attraction force between the split droplet 49e and the nozzle plate 51. As the volume and the moving speed of each of the split droplets 49e is small, the split droplet 49e is attracted toward the nozzle plate 51.

Figure 12:
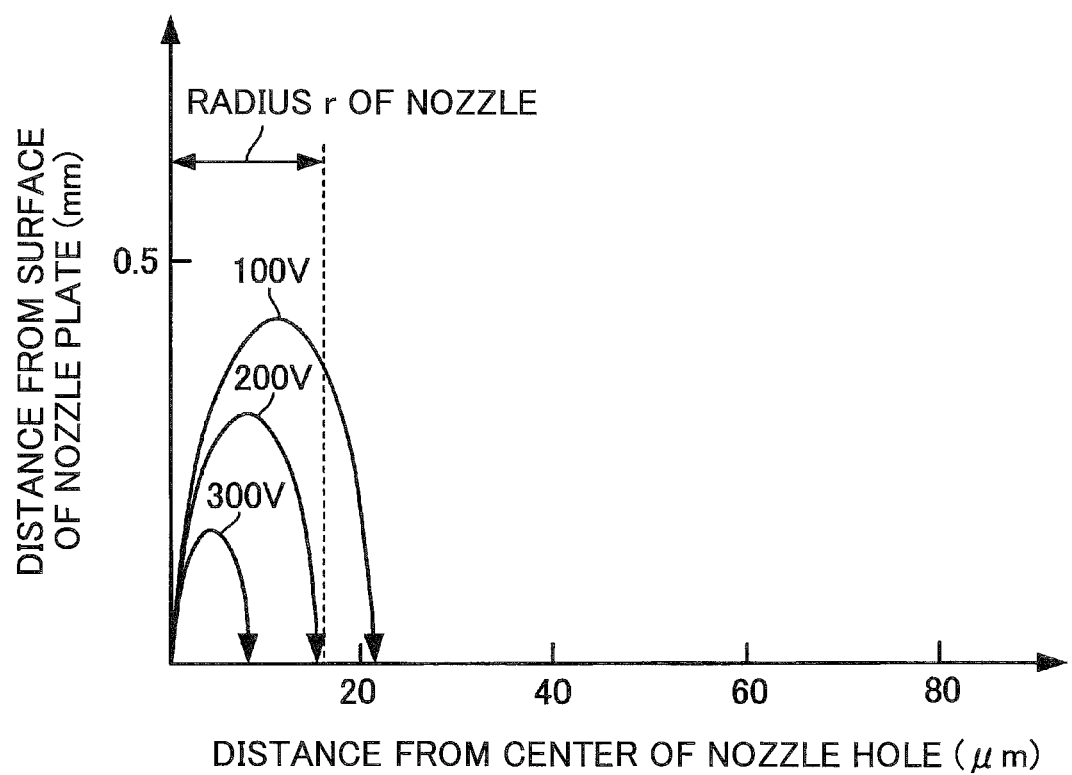
FIG. 12 is a graph showing a path of a droplet discharged from the nozzle hole in relationship between the distance from the center of the nozzle hole and the distance from the surface of the nozzle plate.

By properly adjusting the applying voltage between the nozzle plate 51 and the deflection electrode 57, the position for collecting the split droplet 49e can be adjusted (see FIG. 12). Further, by setting the applying voltage between the nozzle plate 51 and the deflection electrode 57 to larger than a predetermined value, the split droplet 49e can be collected in the nozzle hole 54 (see FIG. 12).

Figure 8:
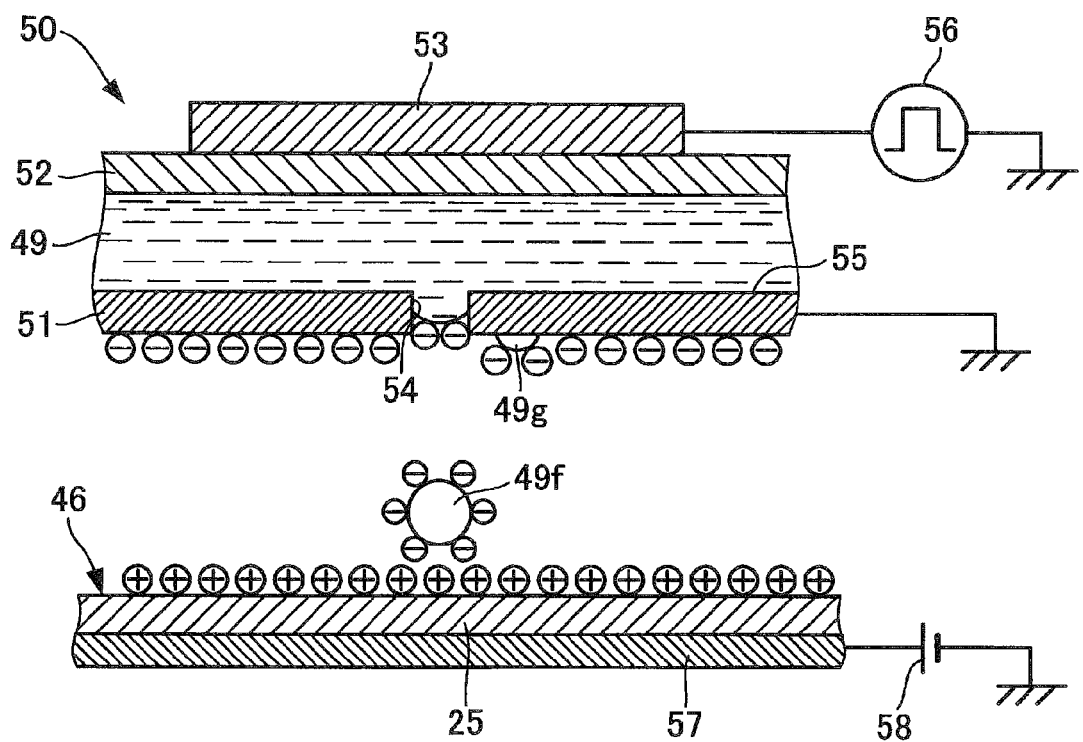
FIG. 8 is a cross sectional view showing an example of a manufacturing process of an electromechanical transducer layer.

The split droplet 49e may be collected into the PZT solution 49 from the nozzle hole 54 or may become a droplet attached to the surface of the nozzle plate 51 as shown in FIG. 8 (collecting process). With this, the split droplet 49e is collected without attaching to the surface of the substrate structure 25. Therefore, patterning failure because of the split droplet 49e attached on the surface of the substrate structure 25 at positions where the PZT solution 49 is not intended to be coated can be prevented.

Further, as the positively charged split droplet 49e is split from the main droplet 49d, the main droplet 49f becomes negatively charged as shown in FIG. 8. Therefore, there is an electrostatic attraction force between the main droplet 49f and the positively charged substrate structure 25 so that the PZT solution 49 is surely coated on the substrate structure 25 (main droplet coating process).

The droplet 49g not collected in the nozzle hole 54 can be removed by appropriately cleaning the nozzle plate 51. With this operation, the droplet 49g can also be removed by a simple operation of cleaning of the nozzle plate 51.

The structure and operation of a liquid discharging apparatus 100 including the liquid discharging head 50 is explained.

Figure 9:
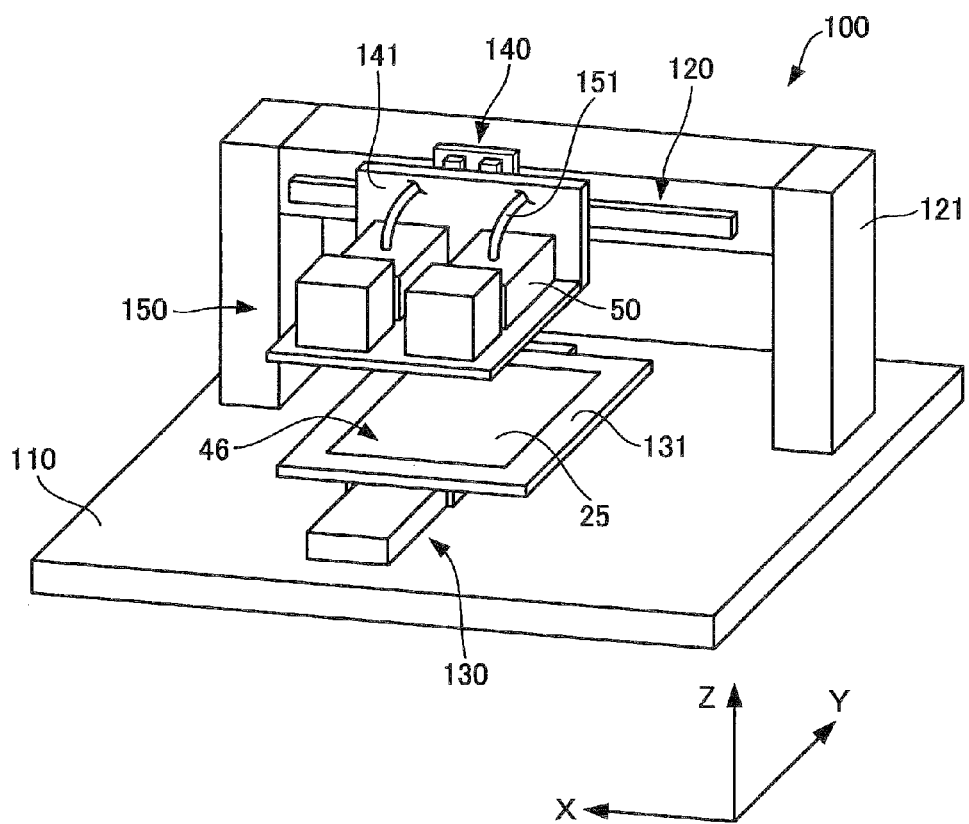
FIG. 9 is a perspective view showing an example of a liquid discharging apparatus.

FIG. 9 is a perspective view showing an example of the liquid discharging apparatus 100.

As shown in FIG. 9, the liquid discharging apparatus 100 includes a base 110, an X-axis direction driving unit 120, a Y-axis direction driving unit 130, a Z-axis direction driving unit 140 and a liquid discharging unit 150. The base 110 is in a flat plate shape. The Y-axis direction driving unit 130 and the X-axis direction driving unit 120 are placed on the base 110.

The Y-axis direction driving unit 130 includes a stage 131 and a Y-axis direction driving member (not shown in the drawings). The Y-axis direction driving member is provided to move the stage 131 in the Y-axis direction.

The substrate structure 25 including the silicon substrate 20, the vibration layer 30 and the lower electrode 41 stacked in this order is mounted on the stage 131. In this embodiment, the substrate structure 25 is mounted on the stage 131 after the surface reforming process as described above is performed on the surface (metal layer 46) of the substrate structure 25.

The stage 131 includes the deflection electrode 57 (not shown in FIG. 9) and an attracting unit (not shown in the drawings).

The attracting unit fixes the substrate structure 25 to the deflection electrode 57 with a negative pressure, by electrostatic or the like. The voltage apply power source 58 is connected to the deflection electrode 57 (see FIG. 4).

The X-axis direction driving unit 120 includes a support member 121 and an X-axis direction driving member (not shown in the drawings). The X-axis direction driving member is supported by the support member 121 and holds the Z-axis direction driving unit 140 to move the Z-axis direction driving unit 140 in the X-axis direction.

The Z-axis direction driving unit 140 includes a head base 141 and a Z-axis direction driving member (not shown in the drawings). The Z-axis direction driving member is provided to move the head base 141 in the Z-axis direction.

The liquid discharging unit 150 includes the liquid discharging head 50 and a supply pipe 151. The liquid discharging unit 150 is mounted on the head base 141. The PZT solution 49 is provided to the liquid discharging head 50 from a liquid tank (not shown in the drawings) by the supply pipe 151. The drive power source 56 is connected to the liquid discharging head 50 (see FIG. 4). The liquid discharging unit 150 may include plural sets of the liquid discharging head 50 and the supply pipe 151.

As described above, according to the inkjet head 1 of the embodiment, the electromechanical transducer layer 43 having a desired pattern can be formed with high accuracy without attaching unnecessary droplets of the PZT solution 49 on the lower electrode 41 when forming the electromechanical transducer layer 43. Therefore, the generation of liquid discharging failure caused by the failure in driving the vibration layer can be prevented, stable liquid discharging characteristic can be obtained, and image quality can be improved.

Further, according to the method of manufacturing the electromechanical transducer layer of the embodiment, as the surface of the metal layer 46 is reformed before coating the PZT solution 49, the PZT solution 49 is difficult to coat on the surface of the metal layer 46 where the SAM layer 47 is formed, so that the PZT solution 49 is selectively coated at a desired position. With this, the electromechanical transducer layers 43 having a desired pattern can be formed with high accuracy.

Further, the structure and operation of an inkjet recording apparatus 5 including the inkjet head 1 is explained.

Figure 10:
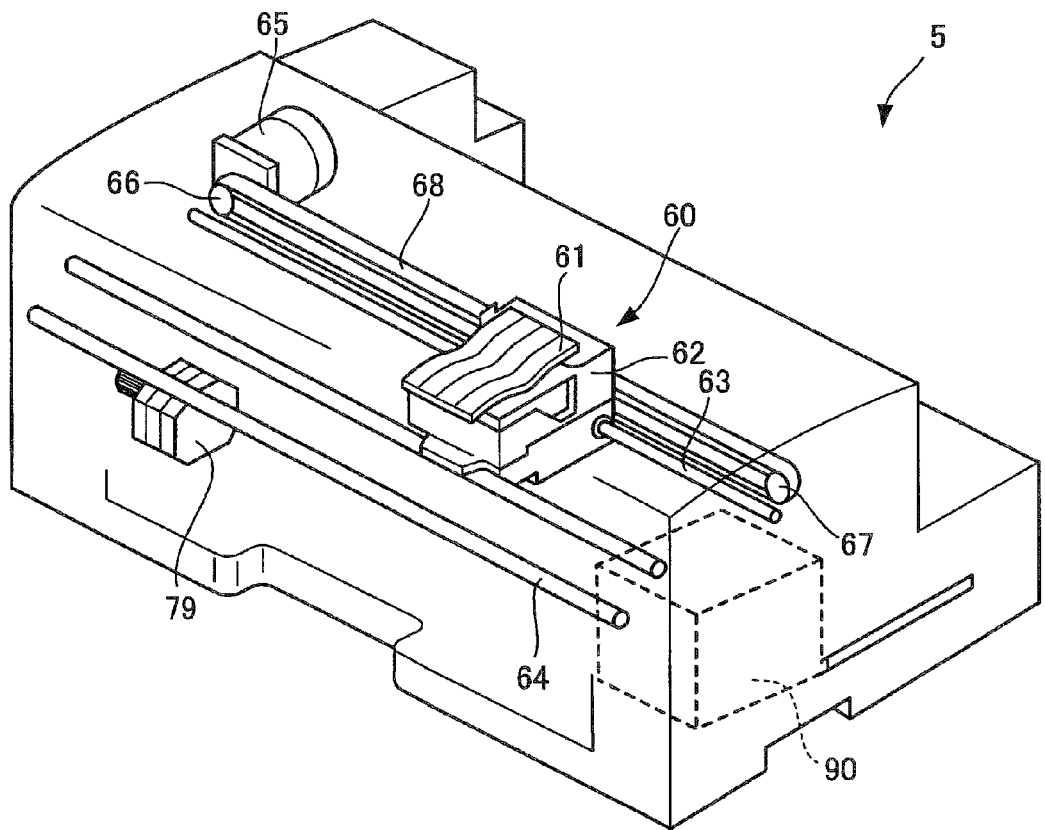
FIG. 10 is a perspective view showing an example of an inkjet recording apparatus of an embodiment.
Figure 11:
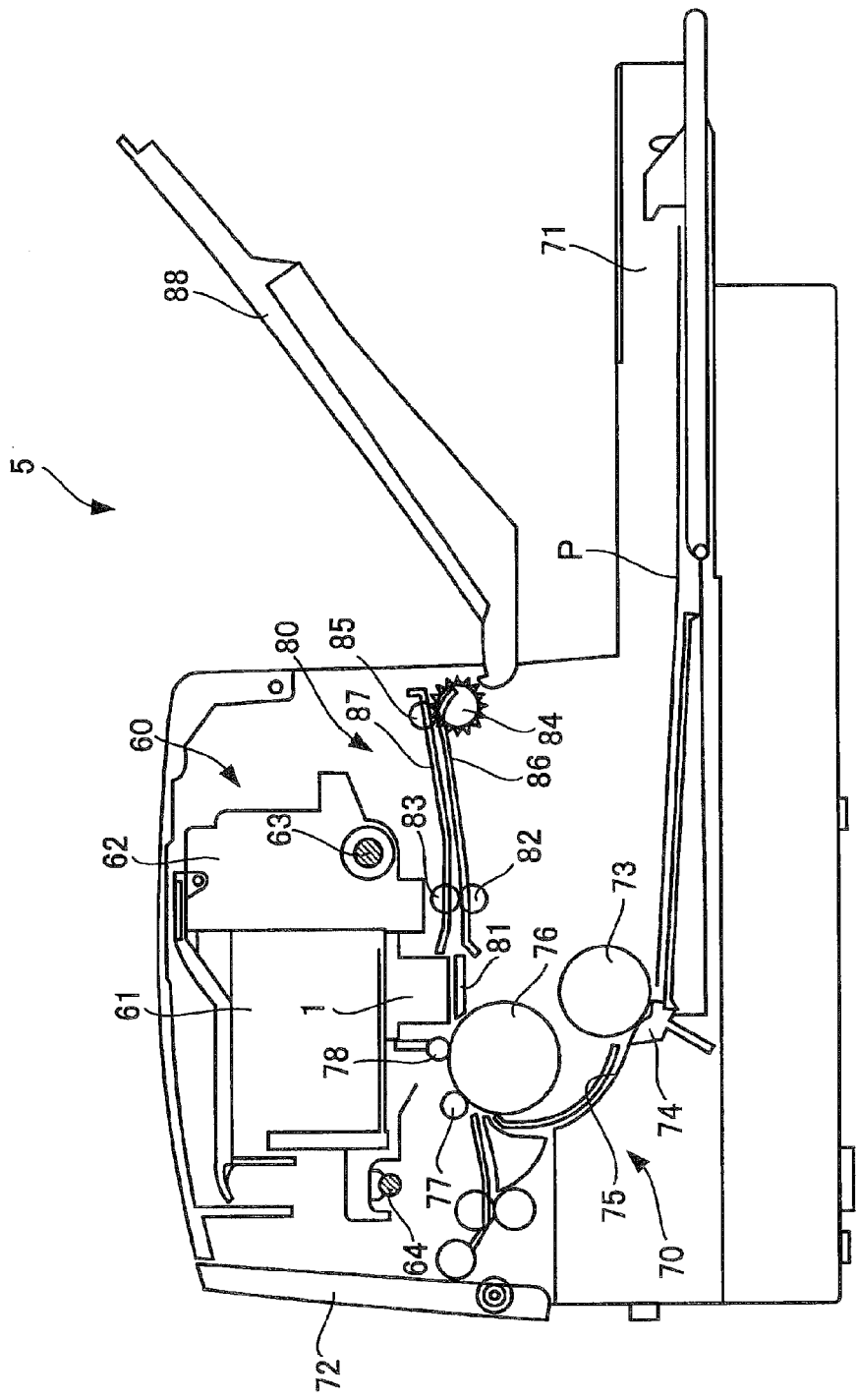
FIG. 11 is a cross sectional view showing an example of an inkjet recording apparatus of an embodiment.

FIG. 10 is a perspective view showing an example of the inkjet recording apparatus 5 of the embodiment. FIG. 11 is a cross sectional view showing an example of the inkjet recording apparatus 5 of the embodiment.

As shown in FIG. 10 and FIG. 11, the inkjet recording apparatus 5 includes an image forming unit 60 that forms an image on a recording medium P, a paper feeding mechanical unit 70 that feeds the recording medium P such as a paper or the like, a paper ejecting mechanical unit 80 that ejects the recording medium P and a recovering unit 90.

The image forming unit 60 includes the inkjet heads 1, ink cartridges 61, a carriage 62, a main guide rod 63, a sub guide rod 64, a main scanning motor 65, a drive pulley 66, a driven pulley 67 and a timing belt 68.

The image forming unit 60 includes four inkjet heads 1 to discharge ink droplets of four colors including yellow (Y), magenta (M), cyan (C) and black (Bk). Each of the inkjet heads 1 is provided with the plural nozzle holes 11 (see FIG. 1 and FIG. 2) aligned as a line in a sub-scanning direction. The inkjet heads 1 are attached to the carriage 62 so that the plural nozzle holes 11 face downward to discharge ink droplets downward.

Alternatively, the image forming unit 60 may include one inkjet head 1 provided with plural nozzle holes 11 including groups of nozzle holes 11 respectively provided to discharge ink droplets of four colors.

The ink cartridge 61 includes an open port (not shown in the drawings) provided at its upper portion to be in communication with the atmosphere, a supply port (not shown in the drawings) provided at its lower portion to supply the ink to the inkjet head 1 and a porous member (not shown in the drawings) provided inside and filled with the ink. In the porous member, the ink to be supplied to the inkjet head 1 is maintained at a slightly negative pressure by a capillary force. With this, the ink cartridge 61 is capable of supplying the ink to the inkjet head 1.

The main guide rod 63 and the sub guide rod 64 are held by side plates (not shown in the drawings) and slidably hold the carriage 62 in the main scanning direction.

The ink cartridges 61 are exchangeably attached to the carriage 62. The back side (downstream of the transferring direction of a paper) of the carriage 62 is slidably attached to the main guide rod 63 and the front side (upstream of the transferring direction of the paper) of the carriage 62 is slidably attached to the sub guide rod 64.

The drive pulley 66 and the driven pulley 67 are placed at end positions in the main scanning direction. The drive pulley 66 is attached to the main scanning motor to be rotated.

The timing belt 68 is held by the drive pulley 66 and the driven pulley 67. The timing belt 68 is fixed to the carriage 62. By the rotation of the main scanning motor in the forward direction and the reverse direction, motive power is transferred to the carriage 62 through the drive pulley 66 and the timing belt 68 so that the carriage 62 is moved back and forth in the main scanning direction.

The paper feeding mechanical unit 70 includes a paper-feed cassette 71, a manual paper feed tray 72, a paper feeding roller 73, a friction pad 74, a guide member 75, a transfer roller 76, a roller 77, a front edge roller 78, a sub-scanning roller 79 and a receiving member 81.

The paper-feed cassette 71 (or a paper-feed tray) is provided at the lower part of the inkjet recording apparatus 5. The paper-feed cassette 71 is capable of receiving plural recording mediums P from the front side and stacking them. The paper-feed cassette 71 is detachably attached to the inkjet recording apparatus 5.

The manual paper feed tray 72 is capable of being opened and laid horizontally. By opening the manual paper feed tray 72 to be laid horizontally, the recording medium P can be manually fed. The paper feeding roller 73 and the friction pad 74 separately feed each of the recording mediums P set in the paper-feed cassette 71. The guide member 75 guides the recording medium P.

The transfer roller 76 reverses the fed recording medium P and further transfers the recording medium P. The roller 77 is pushed to the surface of the transfer roller 76 and holds the recording medium P with the transfer roller 76. The front edge roller 78 defines an angle of the recording medium P transferred from the transfer roller 76.

The sub-scanning roller 79 is connected to the transfer roller 76 through gears to rotate the transfer roller 76. The receiving member 81 is provided to correspond to the range where the carriage 62 moves in the main scanning direction. The receiving member 81 guides the recording medium P transferred from the transfer roller 76 at the lower side of the inkjet heads 1.

The paper ejecting mechanical unit 80 includes a roller 82, a spur 83, a paper ejecting roller 84, a spur 85, an upper guide member 86, a lower guide member 87 and a paper-catch tray 88.

The roller 82 and the spur 83 are provided at the downstream of the transferring direction of the recording medium P of the receiving member 81. The roller 82 and the spur 83 are rotated to further transfer the recording medium P. The paper ejecting roller 84 and the spur 85 further transfer the recording medium P to the paper-catch tray 88. The upper guide member 86 and the lower guide member 87 form a paper ejecting path between the receiving member 81 and the paper-catch tray 88. The paper-catch tray 88 is provided at the back side surface of the inkjet recording apparatus 5.

The recovering unit 90 recovers failure in discharging of the inkjet heads 1. The recovering unit 90 is provided at the right side in FIG. 10 which is not the recording range of the carriage 62. The recovering unit 90 includes a capping member (not shown in the drawings), a suctioning member (not shown in the drawings) and a cleaning member (not shown in the drawings).

The operation of the inkjet recording apparatus 5 is explained.

The recording medium P is set in the paper-feed cassette 71 or in the manual paper feed tray 72. The recording medium P is introduced into the inkjet recording apparatus 5 and transferred to the position below the inkjet heads 1 by the paper feeding mechanical unit 70.

When printing, the inkjet heads 1 are driven in accordance with an image signal while the carriage 62 is moved by the image forming unit 60. With this, a line of an image is recorded on the still recording medium P by discharging the ink, then the recording medium P is transferred for a predetermined amount and the next line of the image is recorded on the still recording medium P by discharging the ink. When a terminating signal or a signal indicating that the back edge of the recording medium P is reached to the recording area is received, the recording operation of the image forming unit 60 is terminated. Then, the recording medium P is ejected in the paper-catch tray 88 by the paper ejecting mechanical unit 80.

When printing is not performed, the carriage 62 is moved to the recovering unit 90, and the inkjet heads 1 are capped by the capping member. By capping the inkjet heads 1, the moistures in the nozzle holes 11 can be maintained, and failure in discharging because of drying of the ink can be prevented. Further, during printing or the like, the ink not used for printing may be discharged to maintain the viscosity of the ink in whole of the nozzle holes 11 to maintain a stable discharging characteristic.

When a failure in discharging occurs, the nozzle holes 11 of the inkjet heads 1 are sealed by the capping member. Then, the ink and bubbles of the nozzle holes 11 are suctioned by the suctioning member through a tube. With this operation, ink, contaminations or the like attached in the vicinity of the nozzle holes 11 of the nozzle plate 10 are removed by the cleaning member to recover the failure in discharging.

The ink suctioned by the cleaning member is ejected in a waste ink tank, including an ink absorbent, provided below the inkjet recording apparatus 5 and absorbed in the absorbent in the waste ink tank.

As described above, according to the inkjet recording apparatus 5 of the embodiment, as the inkjet recording apparatus 5 includes the above described inkjet heads 1, generation of liquid discharging failure caused by the failure in driving the vibration layer can be prevented, stable liquid discharging characteristic can be obtained, and image quality can be improved.

Although in the above embodiment, the electromechanical transducer layer 43 of a predetermined thickness is obtained by performing the processes once as described in FIG. 3A to FIG. 3E, alternatively, the processes as described in FIG. 3A to FIG. 3E may be performed twice or more to form a stacked structure of electromechanical transducer layers 43 to obtain an electromechanical transducer layer 43 of a predetermined thickness.

In this case, the substrate structure 25 on which the electromechanical transducer layer 43 is already formed on the surface as shown in FIG. 3E is soaked in the alkanethiol solution for a predetermined period, the substrate structure 25 is taken out to be washed by solvent to remove extra alkanethiol and dried. With this, the organic molecules are self-aligned at the surface of the metal layer 46 to form the SAM layer 47.

At this time, the SAM layer 47 is not formed on the thin oxide layer such as the electromechanical transducer layer 43. Therefore, the SAM layer 47 is selectively formed on the surface of the metal layer 46 where the electromechanical transducer layer 43 is not formed.

Therefore, it is not necessary to form the photoresist 48 to remove the SAM layer 47 as shown in FIG. 3B. It means that the process of forming the photoresist 48 and removing the SAM layer 47 using the photoresist 48 as the mask can be omitted at this time. Therefore, the process can be simplified compared with the first time of forming the electromechanical transducer layer 43.

By forming the stacked structure of the electromechanical transducer layers 43 to be a predetermined thickness, the layer having a desired thickness can be obtained without suppressing generation of cracks or the like. The thickness of the electromechanical transducer layer 43 may be about 5 μm, for example (see example 5).

Although in the above embodiment, the hydrophobic layer such as the SAM layer 47 is selectively formed at the first part of the surface (which is hydrophilic) of the lower electrode 41 where the PZT solution 49 is not intended to be coated, it is not so limited. For example, when the surface of the lower electrode 41 is hydrophobic, a surface reforming process by which the second part of the surface of the lower electrode 41 where the PZT solution 49 is intended to be coated selectively becomes hydrophilic, may be performed.

Further, the surface reforming process may be omitted in an alternate example.

Although in the above embodiment, it is described that the first polarity is a positive charge and the second polarity is a negative charge, this may be opposite such that the first polarity is a negative charge and the second polarity is a positive charge. It means that the nozzle plate 51 may be positively charged and the substrate structure 25 may be negatively charged. In this case, the polarities as explained with reference to FIG. 4 to FIG. 8 become opposite.

EXAMPLES

Example 1

Using the liquid discharging head 50, the drive power source 56, the deflection electrode 57 and the voltage apply power source 58 shown in FIG. 4, the PZT solution 49 was discharged. The generated split droplet 49e was collected by the nozzle plate 51. The path of the collected split droplet 49e was expressed by a relationship between the distance from the center of the nozzle hole 54 and the distance from the surface of the nozzle plate 51 to consider the position of collecting the split droplet 49e.

In this example, the radius r of the nozzle hole 54 was 15 μm. The applied voltage to the deflection electrode 57 at collection was set to 100V, 200V or 300V. The result is shown in FIG. 12.

As shown in FIG. 12, when the applied voltage is varied and the electric field intensity between the nozzle plate 51 and the deflection electrode 57 varies, the position of collecting the split droplet 49e varies. When the applied voltage became large, the position of collecting the split droplet 49e became close to the center of the nozzle hole 54. In this example, when the diameter of the nozzle hole 54 was 30 μm, and the applied voltage is more than or equal to 200V (for the case of 200V and 300V), the split droplet 49e was collected in the nozzle hole 54.

It can be said that by appropriately adjusting the applied voltage between the nozzle plate 51 and the deflection electrode 57, the position of collecting the split droplet 49e can be properly adjusted. Further, by setting the applied voltage between the nozzle plate 51 and the deflection electrode 57 to more than a predetermined value, the split droplet 49e can be collected in the nozzle hole 54.

Example 2

The electromechanical transducer layer 43 was formed on the surface of the metal layer 46 composed of platinum by discharging the PZT solution 49 in accordance with the method described above with reference to FIG. 3 to FIG. 8 by the liquid discharging apparatus 100 as shown in FIG. 9.

As for a source material for the PZT solution 49, lead acetate trihydrate, isopropoxide titanium and normal butoxide zirconium were used. Crystallized water of lead acetate was dissolved in methoxyethanol, and was dehydrated. In order to prevent lowering the crystalline characteristic because of loosing lead during heat treatment, the amount of lead was set 10 mol % more than a stoichiometric composition.

After dissolving isopropoxide titanium and normal butoxide zirconium in methoxyethanol, an alcohol exchanging and esterification reaction was performed. Then, the reaction was mixed with the methoxyethanol solution in which lead acetate was dissolved to synthesize the PZT solution 49.

The thickness of the electromechanical transducer layer 43 obtained by a single process of forming a layer may be less than or equal to 100 nm in order to prevent the generation of cracks at crystallization. Therefore, the concentration of the PZT in the PZT solution 49 may be adjusted based on the dimension of forming the electromechanical transducer layer 43 and the coating amount of the PZT solution 49. In this example, the concentration of the PZT in the PZT solution 49 was set to 0.1 mol/L.

However, the concentration of the PZT in the PZT solution 49 is not limited to 0.1 mol/L. When the concentration of the PZT in the PZT solution 49 is higher, the thickness of the formed electromechanical transducer layer 43 becomes thicker. Therefore, the concentration of the PZT in the PZT solution 49 may be appropriately set in accordance with the purposed thickness of the electromechanical transducer layer 43.

Here, PZT is a solid solution of lead zirconate ($PbZrO_3$) and lead titanate ($PbTiO_3$). The PZT has a different characteristic based on the ratio of lead zirconate ($PbZrO_3$) and lead titanate ($PbTiO_3$). Generally the ratio of $PbZrO_3$ to $PbTiO_3$ may be 53:47 to obtain a good piezoelectric characteristic. In this case, it is shown as $Pb(Zr0.53, Ti0.47)O_3$ or PZT (53/47). The amount of the source materials for the PZT solution 49, such as lead acetate trihydrate, isopropoxide titanium (titanium alkoxide compound) and normal butoxide zirconium (metal alkoxide compound) are measured to have the above ratio.

Further, as a metal alkoxide compound hydrolyzes by water in the air, a stabilizer such as acetylacetone, acetic acid, diethanolamine or the like may be added to the PZT solution 49.

In this example, the surface reforming process in which the SAM layer 47 was selectively formed on the first part of the metal layer 46 (FIG. 3A to FIG. 3C), the solution coating process in which the PZT solution 49 was coated on the metal layer 46 by the liquid discharging apparatus 100 (FIG. 3D), the drying process in which the coated PZT solution 49 was dried at a predetermined temperature (120° C.) (FIG. 3E) and the pyrolytically decomposing process in which the dried PZT solution 49 was pyrolytically decomposed at a predetermined temperature (500° C.) (FIG. 3E) were performed once.

With these processes, a layer having a predetermined pattern with a thickness of 100 nm was formed on the surface of the metal layer 46 (platinum layer).

Then, the surface reforming process, the solution coating process, the drying process and the pyrolytically decomposing process were repeated for six times to obtain a layer having the predetermined pattern with a thickness of 600 nm. Thereafter, the crystallization process at 700° C. was applied to the obtained layer with a thickness of 600 nm by rapid thermal anneal (RTA).

As a result, the electromechanical transducer layer 43 having the predetermined pattern with a thickness of 600 nm was formed on the surface of the metal layer 46. Failures such as cracks or the like were not generated in the electromechanical transducer layer 43. Further, as the split droplets 49e were collected, patterning failure in which the PZT solution 49 is coated at unnecessary parts of the metal layer 46 did not occur.

Example 3

In this example, processes were further performed to the electromechanical transducer layer 43 with a thickness of 600 nm obtained in example 2. In this example, the surface reforming process, the solution coating process, the drying process (120° C.) and the pyrolytically decomposing process (500° C.) were further repeated for six times and the crystallization process was repeated twice.

As a result, the electromechanical transducer layer 43 having the predetermined pattern with a thickness of 1000 nm was obtained. Failures such as cracks or the like were not generated in the electromechanical transducer layer 43.

Example 4

In this example, processes were further performed to the electromechanical transducer layer 43 with a thickness of 1000 nm obtained in example 3. In this example, the upper electrode 44 composed of platinum was formed as the upper electrode 44 on the electromechanical transducer layer 43 by sputtering. Then, electrical characteristics and electromechanical transducer characteristics (piezoelectric constant) were evaluated.

Figure 13:
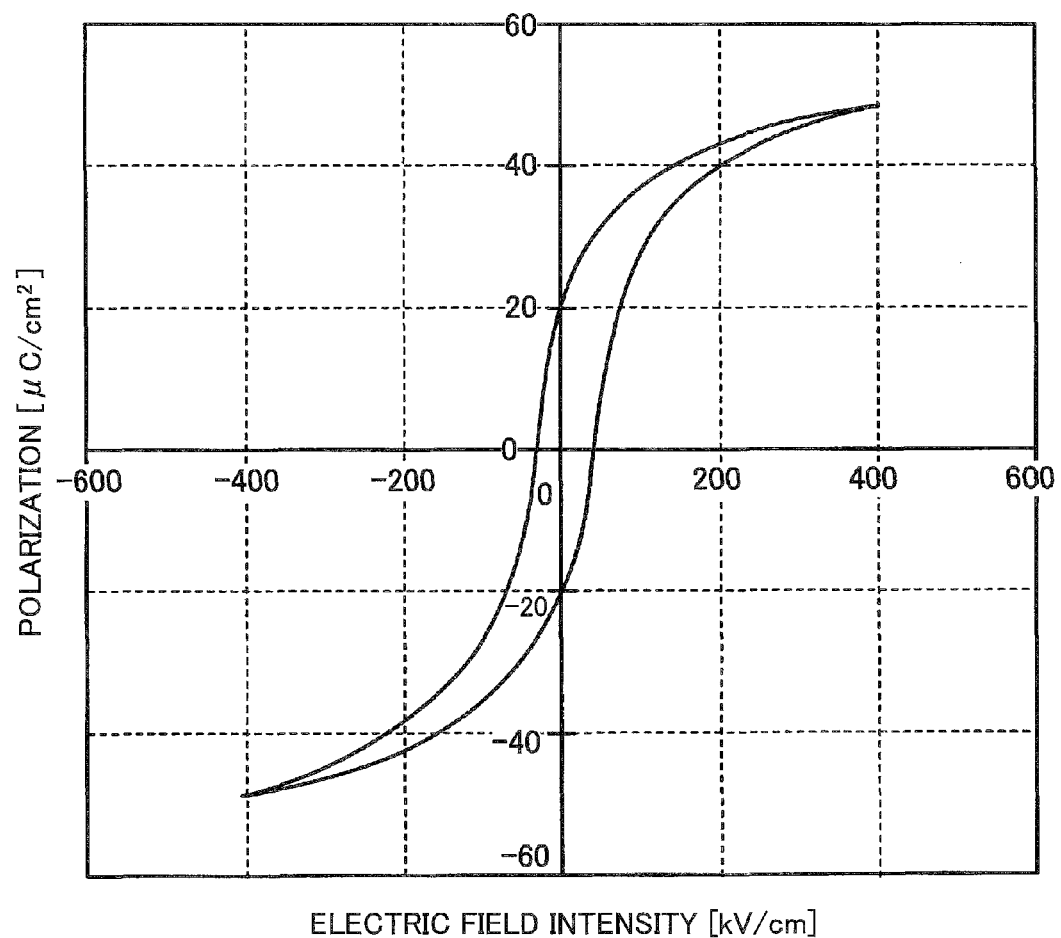
FIG. 13 is a graph showing Hysteresis curves of P (polarization)-E (electric field intensity) of the electromechanical transducer layer.

As a result, for electrical characteristics, hysteresis curves of P (polarization)-E (electric field intensity) as shown in FIG. 13 were obtained. The relative dielectric constant of the electromechanical transducer layer 43 was 1220, the dielectric loss of the electromechanical transducer layer 43 was 0.02, the residual polarization of the electromechanical transducer layer 43 was 19.3 $\mu C/cm^2$ and the coercive electric field was 36.5 kV/cm. It means that the electromechanical transducer layer 43 of the example had electrical characteristics same as a usual ceramic sintered object.

For electromechanical transducer characteristics, the deformation amount by applying voltage was measured by a laser Doppler vibration meter and the characteristics were calculated based on the measured value and simulation. As a result, the piezoelectric constant d31 was 120 pm/V. It means that the electromechanical transducer layer 43 of the example had electromechanical transducer characteristics same as a usual ceramic sintered object. This value is applicable enough for an electromechanical transducer layer (piezoelectric element) for a general inkjet head.

With the above results, the electromechanical transducer layer 43 of the example is applicable enough for an electromechanical transducer layer for a general inkjet head.

Example 5

In this example, processes were further performed to the electromechanical transducer layer 43 with a thickness of 1000 nm obtained in example 3. In this example, without forming the upper electrode 44, the electromechanical transducer layer 43 was further thickened. Concretely, a set of processes including the surface reforming process, the solution coating process, the drying process (120° C.), the pyrolytically decomposing process (500° C.) for six times and then the crystallization process once was repeated for ten times.

As a result, the electromechanical transducer layer 43 having the predetermined pattern with a thickness of 5 $\mu$m was obtained. Failures such as cracks or the like were not generated in the electromechanical transducer layer 43. With this, the electromechanical transducer layer 43 can be thickened to the extent as such based on necessity.

Example 6

Solution including platinum material (platinum ink) was coated, as the upper electrode 44, on the desired area on the electromechanical transducer layer 43 formed on the metal layer 46 by the liquid discharging head 50 of the liquid discharging apparatus 100 shown in FIG. 9. The rest of the process was the same as that in example 2.

When coating the solution including platinum material (platinum ink), the surface where the platinum ink is not to be coated was reformed to be hydrophobic and the surface where the platinum ink is to be coated was made hydrophilic similarly to the process for coating the PZT solution 49 in example 2. Therefore, the coating area was defined by contrast of surface energy between the hydrophobic surface and the hydrophilic surface.

For the upper electrode 44, in order to prevent a short with the lower electrode 41, the upper electrode 44 needs to be formed in a dimension smaller than that of the electromechanical transducer layer 43. Therefore, it is necessary to form the hydrophobic surface on the electromechanical transducer layer 43 in this example. Therefore, in this example, first, a resist was formed on the part where the upper electrode 44 is not intended to be formed. Then, the solution including platinum material (platinum ink) was coated by the liquid discharging head 50, dried at 120° C., the resist was removed and finally sintered at 250° C.

As a result, the upper electrode 44 having a predetermined pattern with a thickness of 0.5 μm was obtained. Failures such as cracks or the like were not generated in the upper electrode 44. The relative resistance (volume resistance) of the upper electrode 44 was $5\times10^{-6}\,\Omega\cdot\mathrm{cm}$. Further, as the split droplets were collected, patterning failure in which the platinum ink is coated at unnecessary parts of the surface did not occur.

Example 7

Instead of the metal layer 46 of the lower electrode 41 composed of platinum, a ruthenium layer was formed. First, a titanium adhesion layer was formed on a thermal oxidation layer formed on a silicon wafer. Then, the ruthenium layer was formed by sputtering ruthenium to obtain the lower electrode 41. The rest of the process such as forming the SAM layer 47 or the like was the same as that in example 2.

Figure 14:
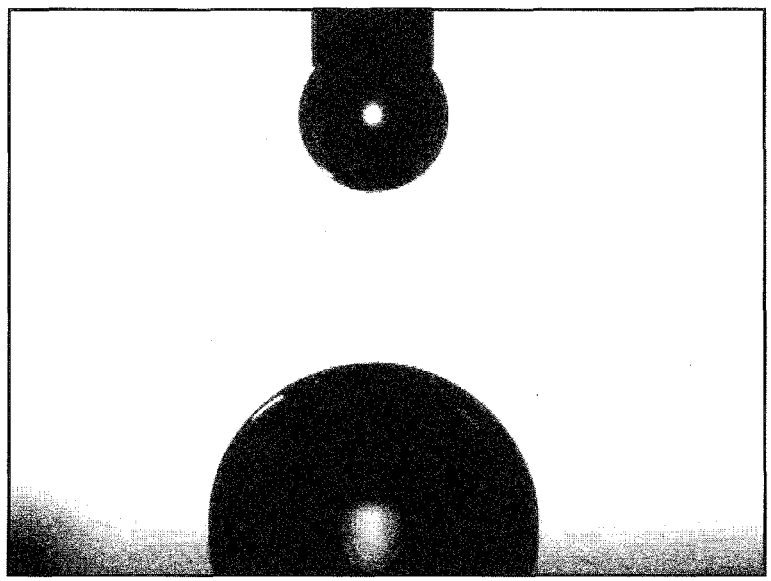
FIG. 14 is a drawing showing angle of contact of pure water on a surface of a Self-Assembled Monolayer (SAM) layer.
Figure 15:
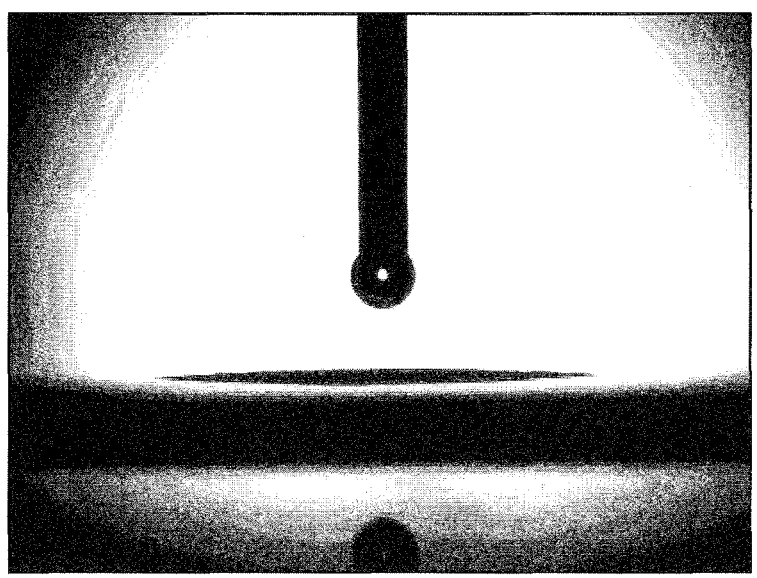
FIG. 15 is a drawing showing angle of contact of pure water on a surface where the SAM layer is removed.

FIG. 14 is a drawing showing the angle of contact of pure water on a surface of the SAM layer 47. As a result, the surface where the SAM layer 47 existed was hydrophobic with the angle of contact of pure water was 92.2° (see FIG. 14). FIG. 15 is a drawing showing the angle of contact of pure water on a surface of the ruthenium layer where the SAM layer 47 was removed. The surface where the SAM layer 47 was removed and the surface of the lower electrode 41 was exposed, was completely wetted and whose angle of contact of pure water was 5° (see FIG. 15).

Example 8

Instead of the metal layer 46 of the lower electrode 41 composed of platinum, an iridium layer was formed. First, a titanium adhesion layer was formed on a thermal oxidation layer formed on a silicon wafer. Then, the iridium layer was formed by sputtering iridium to obtain the lower electrode 41. The rest of the process such as forming the SAM layer 47 or the like was the same as that in example 2.

Example 9

Instead of the metal layer 46 of the lower electrode 41 composed of platinum, a rhodium layer was formed. First, a titanium adhesion layer was formed on a thermal oxidation layer formed on a silicon wafer. Then, the rhodium layer was formed by sputtering rhodium to obtain the lower electrode 41. The rest of the process such as forming the SAM layer 47 or the like was the same as that in example 2.

Example 10

Instead of the metal layer 46 of the lower electrode 41 composed of platinum, a platinum-rhodium layer was formed. First, a titanium adhesion layer was formed on a thermal oxidation layer formed on a silicon wafer. Then, the platinum-rhodium layer was formed by sputtering platinum-rhodium (concentration of rhodium was 15 wt %) to obtain the lower electrode 41. The rest of the process such as forming the SAM layer 47 or the like was the same as that in example 2.

Example 11

Instead of the metal layer 46 of the lower electrode 41 composed of platinum, an iridium layer was formed. The iridium layer was formed on an iridium oxide layer formed on a silicon wafer by sputtering iridium metal to obtain the lower electrode 41. The rest of the process such as forming the SAM layer 47 or the like was the same as that in example 2.

Example 12

As for the metal layer 46 of the lower electrode 41, a platinum layer was formed on an iridium oxide layer formed on a silicon wafer by sputtering platinum to obtain the lower electrode 41. The rest of the process such as forming the SAM layer 47 or the like was the same as that in example 2.

As a result, for example 8 to example 12, the surface where the SAM layer 47 existed was hydrophobic with the angle of contact of pure water was about 90°. The surface where the SAM layer 47 was removed and the surface of the lower electrode 41, was exposed was completely wetted and whose angle of contact of pure water was about 5° for any examples.

According to the embodiment, a method of manufacturing an electromechanical transducer layer by which an electromechanical transducer layer having a desired pattern can be formed with high accuracy without attaching unnecessary droplets of the solution including the source material for forming the electromechanical transducer layer on a substrate structure when discharging the solution from a nozzle of an inkjet head, an electromechanical transducer layer formed by the method, a method of manufacturing an electromechanical transducer element including the electromechanical transducer layer, an electromechanical transducer element formed by the method, an inkjet head and an inkjet recording apparatus can be provided. This can be applicable to an inkjet recording apparatus used in an image recording apparatus such as a printer, a copying machine, a facsimile machine or the like.

With the method of manufacturing the electromechanical transducer layer of the embodiment, micro split droplets discharged from the nozzle hole can be collected before reaching the surface of the substrate. Therefore, the electromechanical transducer layer having a desired pattern can be formed with high accuracy without attaching unnecessary droplets to the surface of the substrate structure.

When the lower electrode (first electrode) is composed of a precious metal element such as platinum or the like, the surface becomes hydrophilic and when a droplet of the solution to form the electromechanical transducer layer is coated on the surface, it may cylindrically spread and may attach to a portion where the solution is not intended to be coated. However according to the method of the embodiment, as a hydrophobic layer is selectively formed on the part of the surface of the lower electrode where the solution is not intended to be coated, the spread of the solution can be prevented.

The present invention is not limited to the specifically disclosed embodiments, and variations and modifications may be made without departing from the scope of the present invention.

The present application is based on Japanese Priority Application No. 2011-29975 filed on Feb. 15, 2011, the entire contents of which are hereby incorporated herein by reference.

What is claimed is:

1. A method of manufacturing an electromechanical transducer layer on a surface of a substrate, comprising:
   placing the substrate so that the surface of the substrate faces a nozzle plate which is provided with a nozzle for discharging a solution including a source material to form the electromechanical transducer layer;
   discharging the solution from the nozzle of the nozzle plate to coat the solution on the surface of the substrate while applying voltage such that a potential difference is present between the nozzle plate and the substrate to charge the nozzle plate at a first polarity and the substrate at a second polarity opposite to the first polarity, the solution discharged from the nozzle including a main droplet which is coated on the surface of the substrate and a split droplet split from the main droplet, the the potential difference present between the nozzle plate and the substrate causes the split droplet to become charged at the second polarity and to be attracted and collected by the nozzle plate; and
   applying a heat treatment to the substrate on which the solution is coated to crystallize the solution to form the electromechanical transducer layer,
   wherein in the discharging the solution, the solution, before being discharged from the nozzle, is also charged at the first polarity.

2. The method of manufacturing an electromechanical transducer layer according to claim 1, wherein in the discharging the solution, the potential difference present between the nozzle plate and the substrate causes the split droplet to become charged at the second polarity and to be attracted by the nozzle plate to be collected in the nozzle.

3. The method of manufacturing an electromechanical transducer layer according to claim 1, further comprising:
   before placing the substrate, performing a surface reforming process so that a first part of the surface of the substrate where the solution is not intended to be coated selectively inhibits the coating of the solution.

4. The method of manufacturing an electromechanical transducer layer according to claim 1, further comprising:
   before placing the substrate, performing a surface reforming process so that a first part of the surface of the substrate where the solution is not intended to be coated becomes hydrophobic while a second part of the surface of the substrate where the solution is intended to be coated becomes hydrophilic.

5. The method of manufacturing an electromechanical transducer layer according to claim 4, wherein the performing the surface reforming process includes
   coating alkanethiol solution on the entire surface of the surface of the substrate to form a hydrophobic layer of alkane on the entire surface of the substrate, and
   selectively removing the hydrophobic layer formed at the second part of the surface of the substrate where the solution is intended to be coated using a mask.

6. The method of manufacturing an electromechanical transducer layer according to claim 5, wherein in the selectively removing the hydrophobic layer, the mask is a photoresist, the hydrophobic layer is selectively removed by etching, and the selectively removing the hydrophobic layer further includes
   forming photoresist at the first part of the surface of the substrate where the solution is not intended to be coated by photolithography, and after removing the mask, removing the photoresist.

7. The method of manufacturing an electromechanical transducer layer according to claim 5, wherein the substrate includes a hydrophilic layer formed at and exposed at its surface before coating the alkanethiol solution.

8. The method of manufacturing an electromechanical transducer layer according to claim 7, wherein the hydrophilic layer is a metal layer.

9. The method of manufacturing an electromechanical transducer layer according to claim 1, wherein the solution is a sol including polar solvent.

10. The method of manufacturing an electromechanical transducer layer according to claim 1, wherein the discharging the solution is repeated for plural times.

11. A method of manufacturing an electromechanical transducer element including a first electrode, an electromechanical transducer layer and a second electrode stacked in this order, comprising:
    forming the electromechanical transducer layer on the first electrode by the method of
    manufacturing the electromechanical transducer layer according to claim 1, the first electrode being the substrate; and
    forming the second electrode on the electromechanical transducer layer.

12. The method of manufacturing an electromechanical transducer element according to claim 11, wherein the forming the second electrode on the electromechanical transducer layer includes
    placing the electromechanical transducer layer so that the surface of the electromechanical transducer layer faces a nozzle plate which is provided with a nozzle for discharging a second solution including a source material to form the second electrode;
    discharging the second solution from the nozzle of the nozzle plate to coat the second solution on the surface of the electromechanical transducer layer; and
    applying a heat treatment to the second solution coated on the electromechanical transducer layer to crystallize the second solution to form the second electrode.

13. The method of manufacturing an electromechanical transducer element according to claim 11, wherein the first electrode includes a metal layer of a metal of a platinum group metal or its oxide, the electromechanical transducer layer is a mixed metal oxide layer, and the second electrode includes a metal layer of a metal included in a platinum group metal or its oxide.

14. An electromechanical transducer layer manufactured by the method of manufacturing the electromechanical transducer layer according to claim 1.

15. An electromechanical transducer element manufactured by the method of manufacturing the electromechanical transducer element according to claim 11.

16. A liquid discharging head comprising the electromechanical transducer element according to claim 15.

17. An inkjet recording apparatus comprising the liquid discharging head according to claim 16.

* * * * *